United States Patent [19]
Seog

[11] Patent Number: 5,994,196
[45] Date of Patent: Nov. 30, 1999

[54] METHODS OF FORMING BIPOLAR JUNCTION TRANSISTORS USING SIMULTANEOUS BASE AND EMITTER DIFFUSION TECHNIQUES

[75] Inventor: Jeon Hee Seog, Kyunggi-do, Rep. of Korea

[73] Assignee: Samsung Electronics Co., Ltd., Rep. of Korea

[21] Appl. No.: 09/047,099

[22] Filed: Mar. 24, 1998

[30] Foreign Application Priority Data

Apr. 1, 1997 [KR] Rep. of Korea ....................... 97-12038

[51] Int. Cl.$^6$ ................................................. H02L 21/265
[52] U.S. Cl. ........................... 438/370; 438/367; 438/368; 438/371; 257/565; 257/588
[58] Field of Search ..................... 438/370, 368, 438/367, 371, 365; 257/588, 586, 574, 565

[56] References Cited

U.S. PATENT DOCUMENTS

| | | | |
|---|---|---|---|
| 4,101,350 | 7/1978 | Possley et al. | 148/175 |
| 4,504,332 | 3/1985 | Shinada | 148/187 |
| 4,531,282 | 7/1985 | Sakai et al. | 29/578 |
| 4,569,123 | 2/1986 | Ishii et al. | 438/368 |
| 4,641,416 | 2/1987 | Iranmanesh et al. | 29/576 W |

(List continued on next page.)

FOREIGN PATENT DOCUMENTS

| | | |
|---|---|---|
| 56-43754 | 4/1981 | Japan . |
| 56-83063 | 7/1981 | Japan . |
| 63-215068 | 9/1988 | Japan . |

(List continued on next page.)

OTHER PUBLICATIONS

Wim van der Wel et al., Poly–Ridge Emitter Transistor (PRET): Simple Low–Power Option To A Bipolar Process; International Devices Meeting 1993,IEDM Technical Digest, Washington, DC, Dec. 5–8, 1993, 17.6.1–17.6.4, pp. 453–456.

(List continued on next page.)

*Primary Examiner*—Donald L. Monin, Jr.
*Assistant Examiner*—Michael Dietrich
*Attorney, Agent, or Firm*—Myers Bigel Sibley & Sajovec

[57] ABSTRACT

Methods of forming bipolar junction transistors include the steps of forming a semiconductor substrate having a highly doped buried collector region therein and an intrinsic collector region extending from the buried collector region to a face of the semiconductor substrate. A first electrically insulating layer and first polysilicon layer are formed on the face. Separate masking and ion implantation steps are then performed to convert the first polysilicon layer into a highly doped first portion of first conductivity type and a highly doped second portion of second conductivity type. The first conductive layer may be patterned to define the emitter contact and base contact and expose the intrinsic collector region. A thin sacrificial polycrystalline silicon layer may be formed on the exposed intrinsic collector region and then intrinsic base region dopants of second conductivity type may be implanted through the thin sacrificial layer and into the intrinsic collector region to define an intrinsic base region therein. Conductive emitter contact and base contact spacers are then formed on the sidewalls of the emitter contact and base contact, respectively. A step is then performed to simultaneously diffuse the dopants implanted into the emitter and base contacts, through the spacers and into the intrinsic base region. Here, the implanted dopants of first conductivity type are diffused from the emitter contact through the corresponding conductive sidewall spacer and into the semiconductor substrate to define an emitter region in the intrinsic base region. Similarly, the implanted dopants of second conductivity type are diffused from the highly doped base contact through the corresponding conductive sidewall spacer and into the semiconductor substrate to define a more highly doped extrinsic base region in a more lightly doped intrinsic base region.

11 Claims, 8 Drawing Sheets

U.S. PATENT DOCUMENTS

| | | | |
|---|---|---|---|
| 4,669,177 | 6/1987 | D'Arrigo et al. | 29/571 |
| 4,722,908 | 2/1988 | Burton | 438/368 |
| 4,746,629 | 5/1988 | Hanagasaki | 437/162 |
| 4,829,016 | 5/1989 | Neudeck | 437/31 |
| 4,830,972 | 5/1989 | Hamasaki | 437/31 |
| 4,849,371 | 7/1989 | Hansen et al. | 437/82 |
| 4,851,362 | 7/1989 | Suzuki | 437/31 |
| 4,900,689 | 2/1990 | Bajor et al. | 437/31 |
| 4,916,083 | 4/1990 | Monkowski et al. | 438/367 |
| 4,927,774 | 5/1990 | Welbourn et al. | 437/31 |
| 4,945,394 | 7/1990 | Palmour et al. | 357/34 |
| 4,974,045 | 11/1990 | Okita | 357/34 |
| 4,988,632 | 1/1991 | Pfiester | 437/31 |
| 4,997,775 | 3/1991 | Cook et al. | 437/31 |
| 5,017,990 | 5/1991 | Chen et al. | 357/34 |
| 5,026,654 | 6/1991 | Tanba et al. | 437/31 |
| 5,086,005 | 2/1992 | Hirakawa | 438/368 |
| 5,118,634 | 6/1992 | Neudeck et al. | 437/31 |
| 5,134,454 | 7/1992 | Neudeck et al. | 357/34 |
| 5,162,966 | 11/1992 | Fujihira | 257/140 |
| 5,177,582 | 1/1993 | Meister et al. | 257/588 |
| 5,382,828 | 1/1995 | Neudeck et al. | 257/586 |
| 5,434,092 | 7/1995 | Neudeck et al. | 437/34 |
| 5,451,546 | 9/1995 | Grubisich et al. | 438/368 |
| 5,541,120 | 7/1996 | Robinson et al. | 438/368 |
| 5,592,017 | 1/1997 | Johnson | 257/588 |
| 5,721,147 | 2/1998 | Yoon | 437/31 |
| 5,747,374 | 5/1998 | Jeon | 438/365 |
| 5,773,349 | 6/1998 | Ham | 438/371 |

FOREIGN PATENT DOCUMENTS

| | | |
|---|---|---|
| 2-1934 | 1/1990 | Japan . |
| 2-1936 | 1/1990 | Japan . |
| 2-5428 | 1/1990 | Japan . |
| 2-58335 | 2/1990 | Japan . |
| 2-151037 | 6/1990 | Japan . |
| 5-182980 | 7/1993 | Japan . |

OTHER PUBLICATIONS

Subramanian et al., *A Full–Wafer SOI Process For 3 Dimensional Integration*; 9$^{th}$ Biennial University/Government/Industry Microelectronics Symposium, Melbourne Fl, Jun. 12–14, 1991, pp. 195–198.

Glen et al., High–Speed Fully Self–Aligned Single–Crystal Contacted Silicon Bipolar Transistor, Electronics Letters, vol. 26, No. 20, Sep. 27, 1990, pp. 1677–1678.

Konaka et al., A 20–ps Si Bipolar IC Using Advanced Super Self–Aligned Process Technology With Collector Ion Implantation, IEEE Transactions on Electron Devices, vol. 36, No. 7, Jul. 1989, pp. 1370–1375.

Yamamoto et al., SDX: A Novel Self–Aligned Technique and Its Application To High–Speed Bipolar LSI's, IEEE Transactions on Electron Devices, vol. 35, No. 10, Oct. 1988, pp. 1601–1608.

Washio et al., Fabrication Process and Device Characteristics of Sidewall Base Contact Structure Transistor Using Two–Step Oxidation of Sidewall Surface, IEEE Transactions on Electron Devices, vol. 35, No. 10, Oct. 1988, pp. 1596–1600.

Konaka et al., A 30–ps Si Bipolar IC Using Super Self–Aligned Process Technology, IEEE Transactions on Electron Devices, Apr. 1986, pp. 526–531.

Sakai et al., High Speed Bipolar ICs Using Super Self–Aligned Process Technology, Proceedings of the 12$^{th}$ Conference on Solid State Devices, Tokyo, 1980; Japanese Journal of Applied Physics, vol. 20 (1981) Supplement 20–1, pp. 155–159.

Chen et al., A Submicrometer High–Performance Bipolar Technology, IEEE Electron Device Letters, vol. 10, No. 8, Aug. 1989, pp. 364–366.

Tang et al., A Symmetrical Bipolar Structure, IEEE 1980, 3.4–, pp. 58–60.

METHODS OF FORMING BIPOLAR JUNCTION TRANSISTORS USING SIMULTANEOUS BASE AND EMITTER DIFFUSION TECHNIQUES

FIELD OF THE INVENTION

The present invention relates to methods of forming integrated circuit semiconductor devices, and more particularly to methods of forming integrated circuit bipolar junction transistors.

BACKGROUND OF THE INVENTION

As state-of-the-art computer systems and circuits evolve, there is a continuing need for higher performance bipolar junction transistors capable of operating at higher switching speeds, with increasing degrees of device integration, and with low rate of failure. There is also a continuing need to shrink or scale down device size to obtain improved device performance. In order to obtain further advances in device scaling, improved lithographic techniques and equipment must be developed. Unfortunately, the lithographic patterning tolerances of state-of-the-art equipment is rapidly reaching its limits. The range of future device geometries and contact line widths require extremely small dimensions. Thus, lithographic errors within the normal tolerance range can impede efforts to further shrink device size. Accordingly, it would be advantageous to develop processes and device geometries less dependent on photolithographic accuracy.

Attempts to reduce dependency on photolithographic accuracy typically include the steps of self-aligning various active regions of the bipolar junction transistor to each other. In a "self-aligned" process, at least one device region is used as an alignment guide for forming a subsequent region(s). Accordingly, self-aligned fabrication processes are less dependent upon precise photolithographic alignment than similarly directed non self-aligned processes. Faster switching speeds can also be obtained, in part, by reducing the lateral and vertical size and parasitic components of individual transistors and increasing the degree of integration. Typical parasitics include base resistance, $r_b$, base-collector capacitance, $C_{bc}$, collector resistance, $r_c$, and collector-substrate capacitance, $C_{cs}$. As these parasitic components are reduced, device performance improves because faster device operation and lower power consumption is possible.

As will be understood by those skilled in the art, attempts to reduce power consumption in bipolar junction transistors have included the use of double-poly structures. But, double-poly structures have suffered from a partial dopant depletion phenomenon associated with the emitter region. An attempt to form improved bipolar junction transistors has also been disclosed in an article by Wim Van der Wel et al., entitled "Poly-Ridge Emifter Transistor (PRET): Simple Low-Power Option to a Bipolar Process", Proceedings IEDM, pp. 453–456 (1993). According to the structure of the disclosed bipolar transistor, an emitter having a width of less than 0.1 $\mu$m may be formed by employing general processing steps instead of more improved lithographic technology. Thus, a bipolar transistor having high performance and low-power consumption can be formed. Unfortunately, the PRET device may suffer from increased parasitic junction capacitance between the base-collector junction.

Thus, notwithstanding the above attempts to form high performance bipolar junction transistors, there continues to be a need for improved methods of forming bipolar junction transistors having reduced dimensions and reduced parasitic junction capacitances.

SUMMARY OF THE INVENTION

It is therefore an object of the present invention to provide improved methods of forming bipolar junction transistors, and transistors formed thereby.

It is another object of the present invention to provide methods of forming bipolar junction transistors having carefully controllable emitter and base dimensions.

It is still another object of the present invention to provide methods of forming bipolar junction transistors with reduced parasitic capacitances between base, emitter and collector regions therein.

These and other objects, features and advantages of the present invention are provided by methods of forming bipolar junction transistors which include the steps of forming a semiconductor substrate having a highly doped buried collector region of first conductivity type extending laterally therein and an intrinsic collector region extending from the buried collector region to a face of the semiconductor substrate. Preferably, the intrinsic collector region forms a nonrectifying junction with the buried collector region (e.g., an N/N+ or P/P+ junction) and is defined to extend between adjacent field oxide isolation regions. A first electrically insulating layer is also preferably formed on the face of the semiconductor substrate, opposite the buried and intrinsic collector regions. A first conductive layer (e.g., polycrystalline silicon) is then formed on the first electrically insulating layer, opposite the face. Separate masking and ion implantation steps are then performed to convert the first conductive layer into a highly doped first portion of first conductivity type and a highly doped second portion of second conductivity type. Here, the first portion of the first conductive layer may comprise a polycrystalline silicon emitter contact of first conductivity type (e.g., N+) and the second portion of the first conductive layer may comprise a polycrystalline silicon base contact of second conductivity type (e.g., P+). In particular, the first conductive layer (and first electrically insulating layer) may be patterned using conventional photolithographically defined etching steps to define the emitter contact and base contact (and expose sidewalls thereof) and expose a portion of the face of the semiconductor substrate extending opposite the intrinsic collector region. According to one embodiment of the present invention, a thin sacrificial polycrystalline silicon layer may be formed on the emitter contact, base contact and exposed portion of the face of the substrate, and then intrinsic base region dopants of second conductivity type (e.g., P-type) may be implanted through the thin sacrificial polycrystalline silicon layer and into the intrinsic collector region to define an intrinsic base region therein. However, according to another embodiment of the present invention, the intrinsic base region dopants are implanted into the intrinsic collector region before the first conductive layer is formed on the first electrically insulating layer.

Conductive emitter contact spacers and base contact spacers are then formed on the sidewalls of the emitter contact and base contact, respectively, in a self-aligned manner. The thickness of these conductive spacers may be carefully controlled by depositing a conformal polycrystalline silicon layer of predetermined thickness on the emitter and base contacts and in the opening defined in the first conductive layer by the patterning step. This conformal polycrystalline silicon layer can then be etched using conventional techniques to expose upper surfaces of the emitter and base contacts and the face of the semiconductor substrate in the opening, and at the same time define conductive sidewall spacers on the sidewalls of the emitter and base contacts.

Here, the width of the sidewall spacers may be carefully controlled by controlling the thickness of the conformal polycrystalline silicon layer and the duration of the etching step. Subsequent to formation of the conductive sidewall spacers, a preferred step is performed to simultaneously diffuse the dopants implanted into the emitter and base contacts, through the spacers and into the intrinsic base region. In particular, the implanted dopants of first conductivity type are diffused from the emitter contact through the corresponding conductive sidewall spacer and into the semiconductor substrate to define an emitter region in the intrinsic base region. Similarly, the implanted dopants of second conductivity type are diffused from the highly doped base contact through the corresponding conductive sidewall spacer and into the semiconductor substrate to define a more highly doped extrinsic base region in a more lightly doped intrinsic base region. Thus, the width of the conductive sidewall spacers can be controlled to define the widths of the subsequently formed emitter and extrinsic base regions. According to a preferred aspect of the invention, a heat treatment step may be performed to cause diffusion of the implanted emitter and base region dopants and activate these dopants.

The present invention may also include the steps of forming a base link-up region by forming a sacrificial insulating layer on the conductive sidewall spacers, and then implanting dopants of second conductivity type through the sacrificial insulating layer and into the intrinsic base region (at a location closely adjacent the extrinsic base region). In addition, sidewall insulating spacers may be formed on the conductive sidewall spacers and then low resistance silicide contact regions may be formed on upper surfaces of the emitter and base contacts and on a portion of the face of the semiconductor substrate extending opposite the intrinsic base region. Emitter and base electrodes may then be formed to ohmically contact the silicide contact layers on the emitter and base contacts, respectively.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 1:
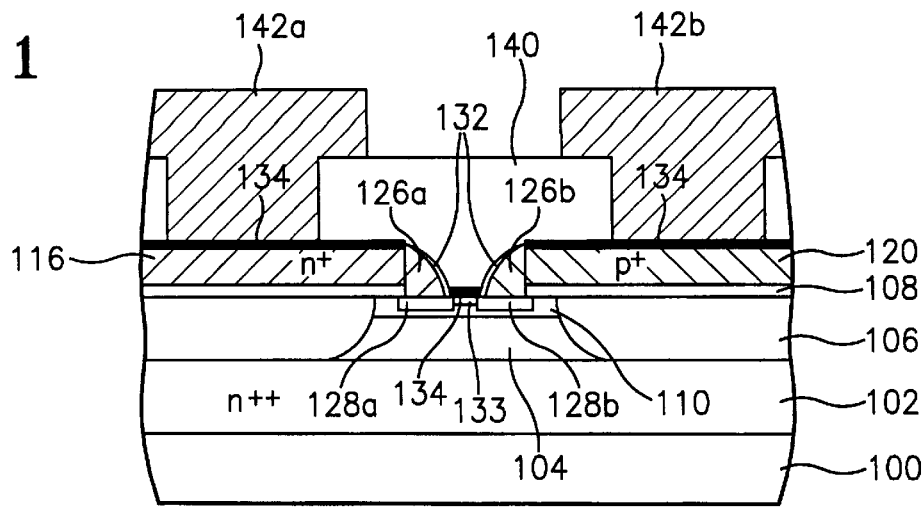
FIG. 1 is a cross-sectional view of an integrated circuit bipolar junction transistor, according to a first embodiment of the present invention.

Referring to FIG. 1, there is provided an NPN-type bipolar transistor according to a first embodiment of the present invention. In this embodiment, an N-type epitaxial layer 104 is formed on a semiconductor substrate 100. An $N^{++}$-type buried layer 102 is formed over the semiconductor substrate 100. The $N^{++}$-type buried layer 102 may be formed using conventional techniques, and serves as the buried collector region (extrinsic collector) of the bipolar transistor. An intrinsic base region 110 is formed on the N-type epitaxial layer 104, and an insulation film 108 (such as a CVD oxide layer) is formed on a device isolation region 106 in such a manner that part of the insulation film 108 overlaps a part of the N-type epitaxial layer 104, as illustrated. An $N^+$-type polysilicon film 116 is formed on the insulation film 108 and overlaps one side of the N-type epitaxial layer 104, and a $P^+$-type polysilicon film 120 is formed on the insulation film 108 and overlaps the other side of the N-type epitaxial layer 104. Further, there are two conductive spacers 126a and 126b. The first conductive spacer 126a is formed on sidewalls of the insulation film 108 and the $N^+$-type polysilicon film 116. The second conductive spacer 126b is formed on sidewalls of the insulating film 108 and the $P^+$-type polysilicon film 120. The spacers 126a and 126b are preferably comprised of polysilicon which is doped by the out-diffusion of $N^+$-type impurity ions and $P^+$-type impurity ions from the $N^+$-type and $P^+$-type polysilicon films 116 and 120, respectively.

An emitter region 128a is formed in the intrinsic base region 110, and extends under the spacer 126a formed at the sidewalls of the insulation film 108 and $N^+$-type polysilicon film 116. The emitter region 128a is formed in such a manner that the $N^+$-type impurity ions therein are out-diffused through the conductive spacer 126a from the $N^+$-type polysilicon film 116. Also, an extrinsic base region 128b is formed in the intrinsic base region 110 and under the conductive spacer 126b formed at the sidewalls of the insulation film 108 and $P^+$-type polysilicon film 120. The extrinsic base region 128b is also formed in such a manner that the $P^+$-type impurity ions therein are out-diffused through the spacer 126b from the $P^+$-type polysilicon film 120. Therefore, the widths of the emitter region 128a and extrinsic base region 128b can be controlled by controlling the width of the spacers 126a and 126b.

Also, in the NPN bipolar transistor, an oxide spacer 132 is additionally formed on the conductive spacers 126a and 126b. A silicide film 134 (intended for decreasing the contact resistance of the base and emitter contact electrodes) is additionally formed on the $N^+$-type and $P^+$-type polysilicon films 116 and 120 and on the portion of the intrinsic base region 110 defined between the spacers 132. Further, a thick insulation film 140 is formed so as to cover the semiconductor substrate 100 including the silicide film 134. An emitter electrode 142a and base electrode 142b are additionally formed in such a manner that they are electrically connected to separate portions of the silicide film 134 so that the emitter and base electrodes 142a and 142b are electrically connected to the $N^+$-type and $P^+$-type polysilicon films 116 and 120, respectively.

Figure 2A:
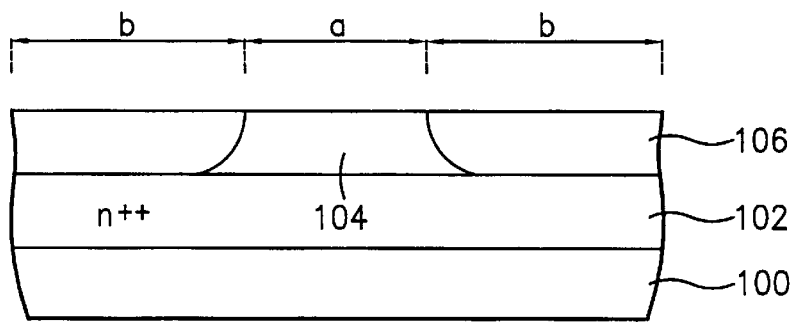
FIGS. 2A–2K are cross-sectional views of intermediate structures which illustrate a preferred method of forming the bipolar junction transistor of FIG. 1.

Referring now to FIGS. 2A–2K, preferred methods of forming the integrated circuit bipolar junction transistor of FIG. 1 will be described. In particular, FIG. 2A illustrates the steps of forming a relatively highly doped N-type buried collector region 102 and a more lightly doped N-type intrinsic collector region 104, in a semiconductor substrate 100. These regions may be defined by forming an N-type epitaxial layer on an N++ buried collector region 102, and then forming field oxide isolation regions 106 in the N-type epitaxial layer to define an intrinsic collector region 104 therein which extends upward to a face of the substrate 100. This intrinsic collector region 104 forms a nonrectifying junction (e.g., N/N++ junction) with the buried collector region 102. Here, region "a" is illustrated as an active region and regions "b" are illustrated as inactive regions which are occupied by the field oxide isolation regions 106.

Figure 2B:
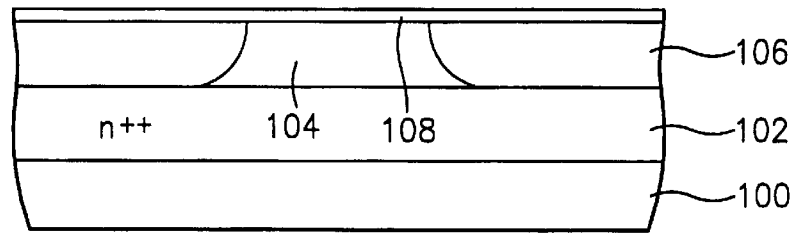
Figure 2C:
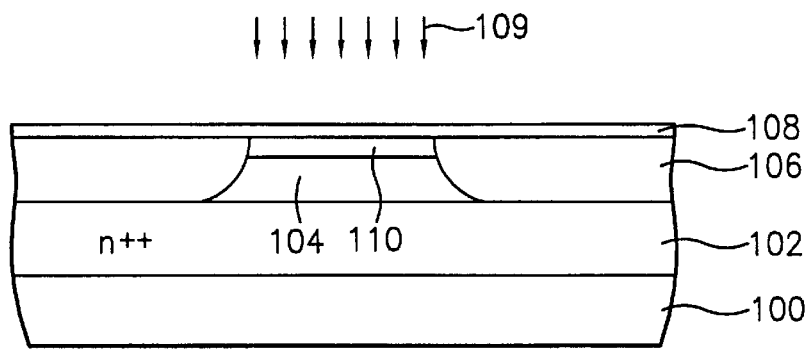

Referring now to FIG. 2B, a first electrically insulating layer 108 is then formed on a face of the substrate 100. As illustrated, this first electrically insulating layer 108 is formed to extend opposite the intrinsic collector region 104 and field oxide isolation regions 106. The first electrically insulating layer 108 may be formed as a silicon dioxide layer having a thickness in a range from between about 100 and 1000 Å. As illustrated by FIG. 2C, dopants 109 of second conductivity type may then be selectively implanted through the first electrically insulating layer 108 and into the intrinsic collector region 104 to define an intrinsic base region 110 which extends to the face of the substrate 100 and forms a P-N junction with the intrinsic collector region 104. Here, the intrinsic base region dopants are preferably implanted through an implant mask (not shown), as will be understood by those skilled in the art.

Figure 2D:
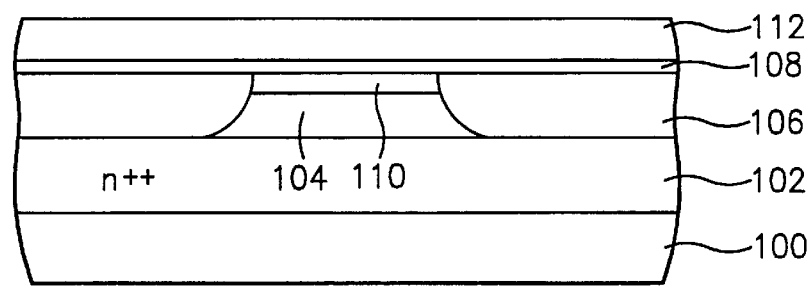
Figure 2E:
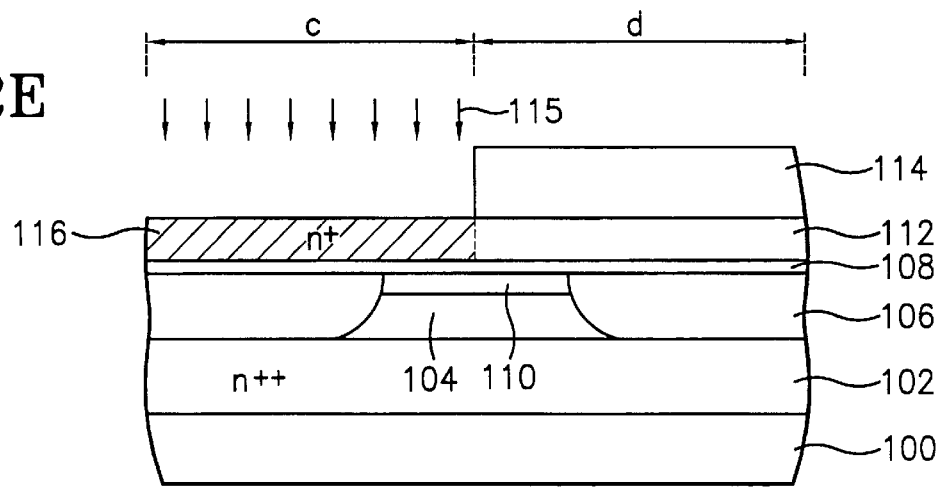
Figure 2F:
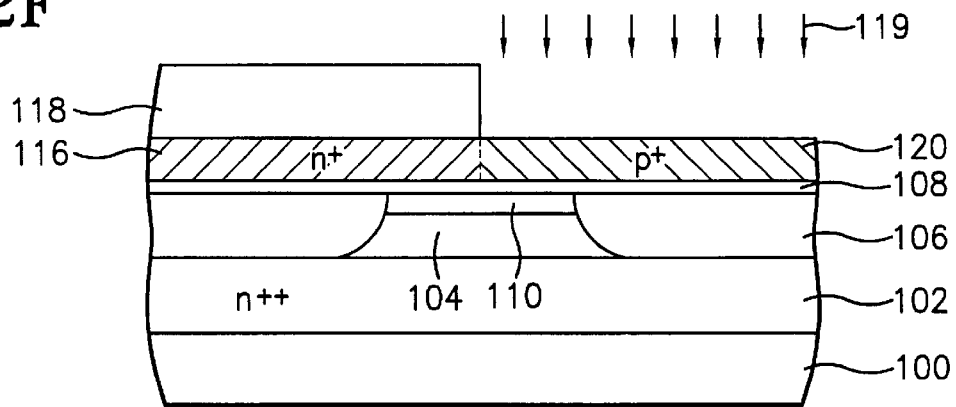

Referring now to FIG. 2D, a first conductive layer 112 is then formed on the first electrically insulating layer 108. This first conductive layer 112 is preferably formed as a polycrystalline silicon layer. This step of forming a first conductive layer 112 may be preceded by the step of depositing an oxide layer (not shown) having a thickness of about 1000 to 2000 Å, on the first electrically insulating layer 108. Referring now to FIG. 2E, an implant mask 114 may then be formed on portion "d" of the first conductive layer 112, to thereby expose portion "c" of the first conductive layer 112. Dopants 115 of first conductivity type (e.g., N-type) are then preferably implanted into a first portion 116 of the first conductive layer 112, to form a highly doped emitter contact of first conductivity type (shown as N+). As described more fully hereinbelow, this first portion 116 comprises an emitter contact of the bipolar junction transistor. Referring now to FIG. 2F, an implant mask 118 is then formed on the first portion 116 of the first conductive layer 112. Dopants 119 of second conductivity type (e.g., P-type) are then preferably implanted into the second portion 120 of the first conductive layer 112, to form a highly doped base contact of second conductivity type (shown as P+) therein. As illustrated best by FIG. 2G, a photolithographically defined etching step is then performed using a mask (not shown) to pattern the first conductive layer 112 and thereby separate the emitter contact 116 from the base contact 120. This patterning step also defines an opening 122 which extends through the first electrically insulating layer 108 and exposes the intrinsic base region 110. Sidewalls to the emitter contact 116 and base contact 120 are also defined, as illustrated.

Figure 2G:
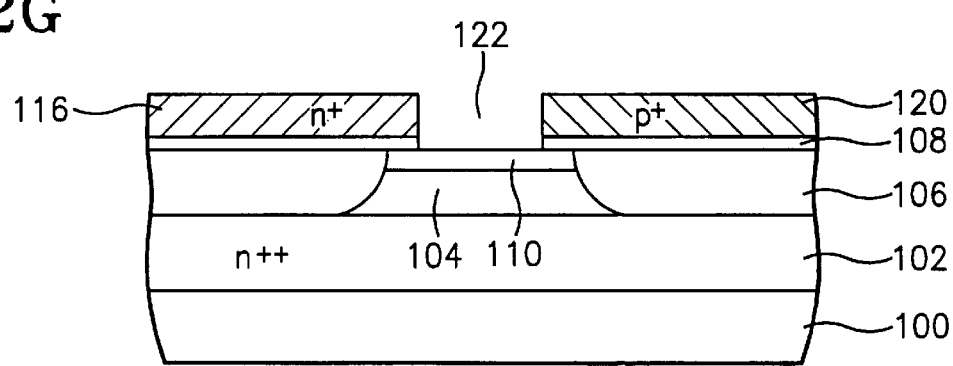
Figure 2H:
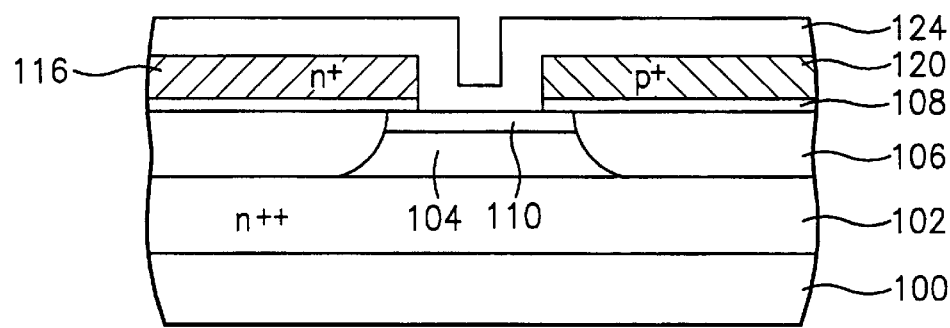
Figure 2I:
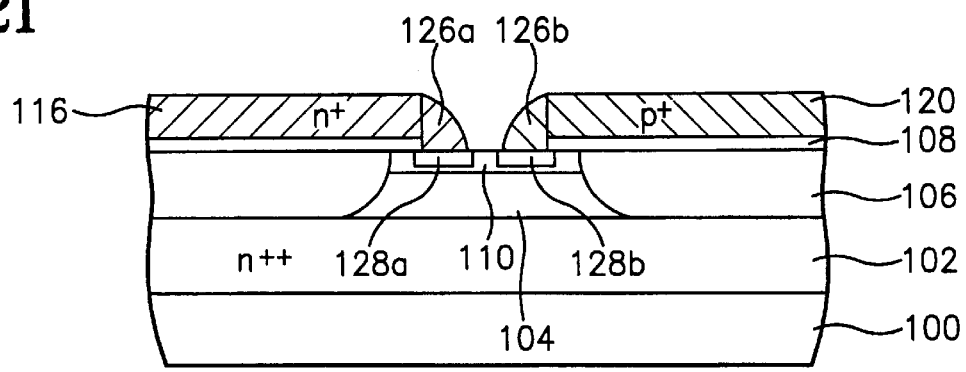

Referring now to FIG. 2H, a second electrically conductive layer 124 of predetermined thickness is then conformally deposited on the structure of FIG. 2G. Here, the second electrically conductive layer 124 may be formed as an undoped polycrystalline silicon layer. The second electrically conductive layer 124 is then patterned to define first and second electrically conductive sidewall spacers 126a and 126b, respectively, as illustrated by FIG. 2I. Here, the electrically conductive sidewall spacers 126a and 126b are formed in a self-aligned manner to the opening 122, by etching the second electrically conductive layer 124 until upper surfaces of the emitter contact 116 and base contact 120 are exposed. Here, the original thickness of the second electrically conductive layer 124 and the duration of the etching step may be carefully controlled to define the widths of the spacers 126a and 126b. A thermal treatment step is also preferably performed to define a self-aligned emitter region 128a and a self-aligned extrinsic base region 128b in the intrinsic base region 110. In particular, a thermal treatment step of sufficient duration is performed to cause diffusion of dopants (e.g., N-type) from the emitter contact 116 to the conductive spacer 126a and into the intrinsic base region 110. This diffusion step defines the emitter region 128a which is self-aligned to the conductive spacer 126a. Similarly, the dopants (e.g., P-type) in the base contact 120 are also diffused through the conductive spacer 126b and into the intrinsic base region 110, to define the extrinsic base region 128b which is self-aligned to the conductive spacer 126b. Here, the extrinsic base region 128b preferably forms a nonrectifying junction (e.g., P+/P) with the intrinsic base region 110.

Figure 2J:
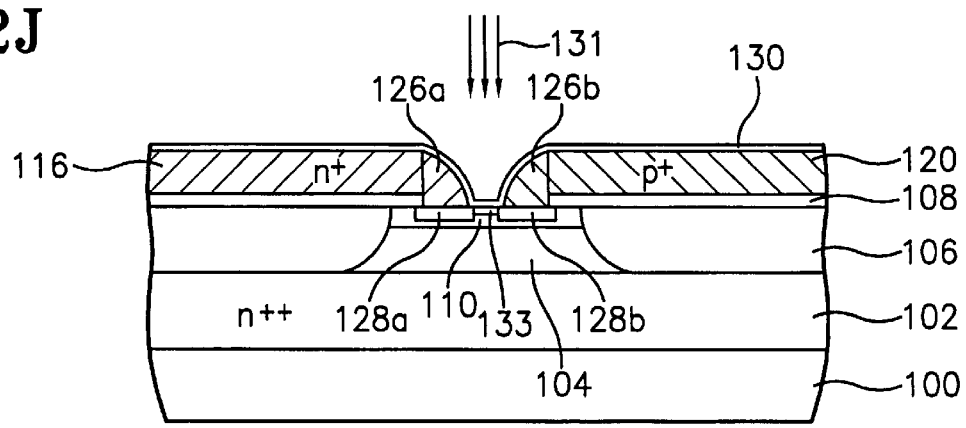

Referring now to FIG. 2J, a thin sacrificial oxide layer 130 is then formed on an upper surface of the emitter contact 116, upper surface of the base contact 120, sidewalls of the conductive spacers 126a and 126b and on an exposed portion of the face of the substrate 100 extending between the adjacent conductive spacers. Dopants 131 of second conductivity type (e.g., P-type) are then selectively implanted through the thin sacrificial oxide layer 130, to define a base link-up region 133 which improves an electrical connection between the intrinsic base region 110 and extrinsic base region 128b. Here, the sacrificial oxide layer 130 is formed to reduce ion implant damage and further anneal and activate the dopants diffused into the emitter and extrinsic base regions 128a and 128b, respectively.

Figure 2K:
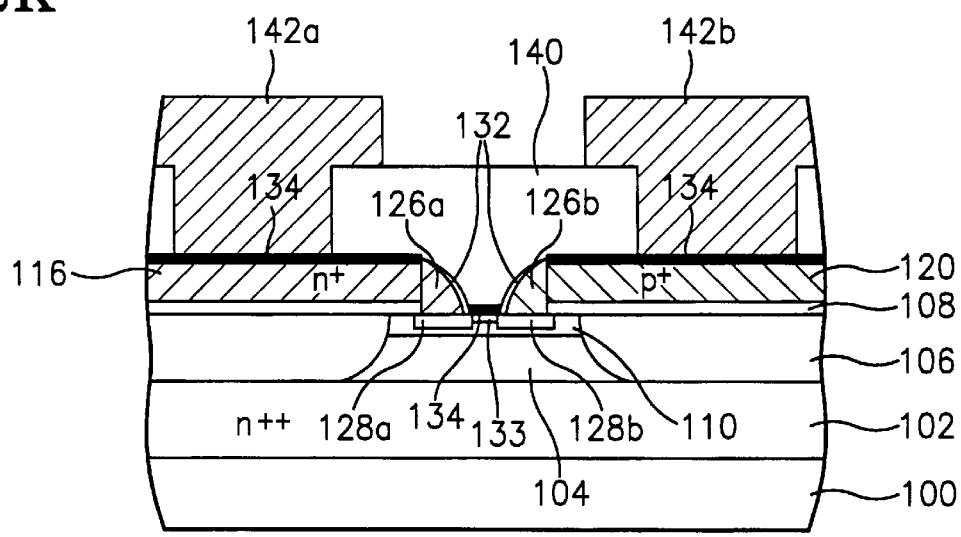

Referring now to FIG. 2K, after the thin sacrificial oxide layer 130 is removed, a blanket oxide layer (not shown) having a thickness in a range from between about 1000 and 2000 Å is formed on upper surfaces of the emitter contact 116, base contact 120, conductive sidewall spacers 126a and 126b, and exposed portion of the substrate 100. This blanket oxide layer is then etched to define sidewall insulating spacers 132 on the conductive sidewall spacers 126a and 126b. According to a preferred aspect of the present invention, a layer of metal suicide 134 may be selectively formed as a low resistance contact layer on an upper surface of the emitter contact 116, upper surface of the base contact 120 and on the base link-up region, as illustrated. The layer of metal silicide 134 may be formed by depositing a respective metal and then converting the deposited layer of metal to metal silicide (using silicon provided by the substrate and emitter and base contacts) and then removing portions of the metal on the sidewall insulating spacers 132 which have not be converted to metal silicide. An electrically insulating passivation layer 140 is then formed, as illustrated. Contact windows are then defined in the passivation layer 140, using conventional techniques, to expose the metal silicide layers 134. Conventional metallization techniques can then be used to form emitter and base electrodes 142a and 142b, respectively, to complete the formation of an N-P-N bipolar junction transistor. Similar steps can also be used to form a P-N-P transistor.

Figure 3:
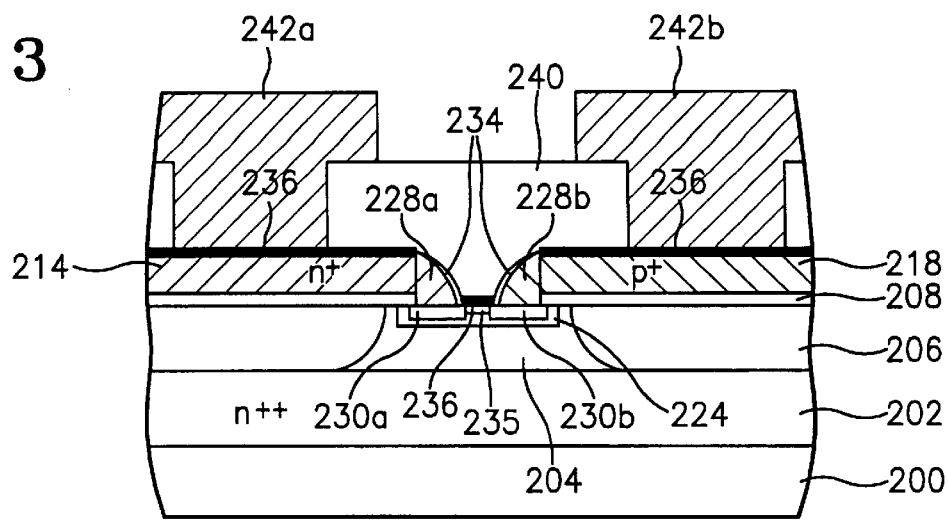
FIG. 3 is a cross-sectional view of an integrated circuit bipolar junction transistor, according to a second embodiment of the present invention.
Figure 4A:
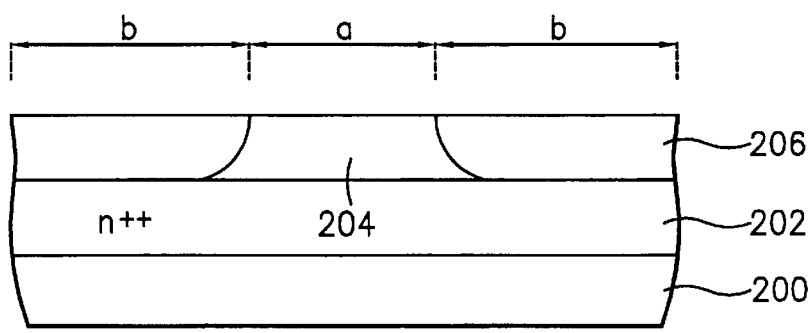
FIGS. 4A–4K are cross-sectional views of intermediate structures which illustrate a preferred method of forming the bipolar junction transistor of FIG. 3.

Referring now to FIGS. 3 and 4A–4K, preferred methods of forming an integrated circuit bipolar junction according to a second embodiment of the present invention will be described. In particular, FIG. 4A illustrates the steps of forming a relatively highly doped N-type buried collector region 202 and a more lightly doped N-type intrinsic collector region 204, in a semiconductor substrate 200. These regions may be defined by forming an N-type epitaxial layer on an N++ buried collector region 202, and then forming field oxide isolation regions 206 in the N-type epitaxial layer to define an intrinsic collector region 204 therein which extends upward to a face of the substrate 200. This intrinsic collector region 204 forms a nonrectifying junction (e.g., N/N++ junction) with the buried collector region 202. Here, region "a" is illustrated as an active region and regions "b" are illustrated as inactive regions which are occupied by the field oxide isolation regions 206.

Figure 4B:
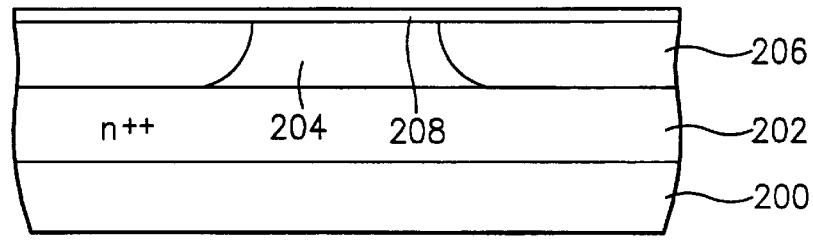

Referring now to FIG. 4B, a first electrically insulating layer 208 is then formed on a face of the substrate 200. As illustrated, this first electrically insulating layer 208 is formed to extend opposite the intrinsic collector region 204 and field oxide isolation regions 206. The first electrically insulating layer 208 may be formed as a silicon dioxide layer having a thickness in a range from between about 100 and 1000Å.

Figure 4C:
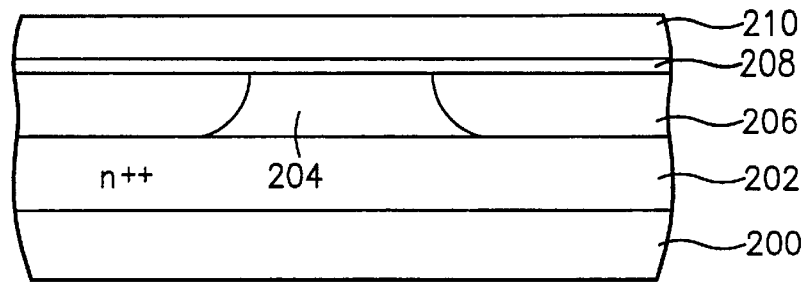
Figure 4D:
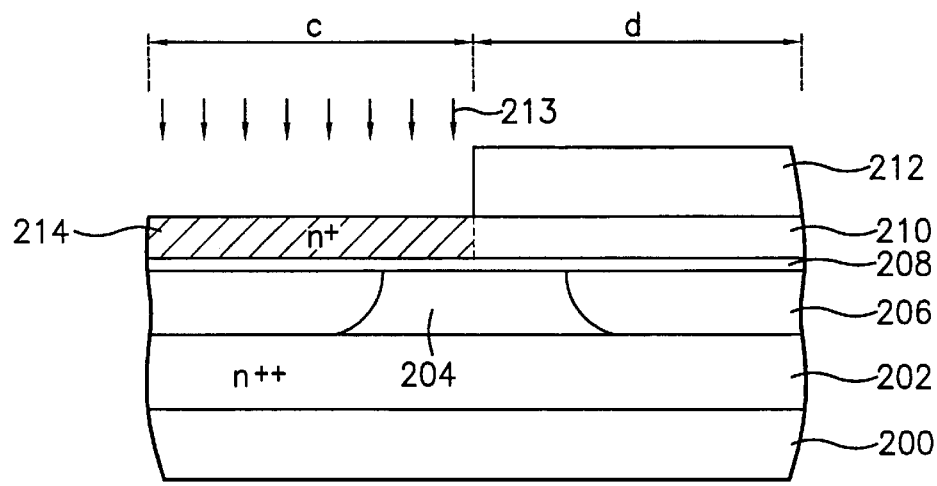
Figure 4E:
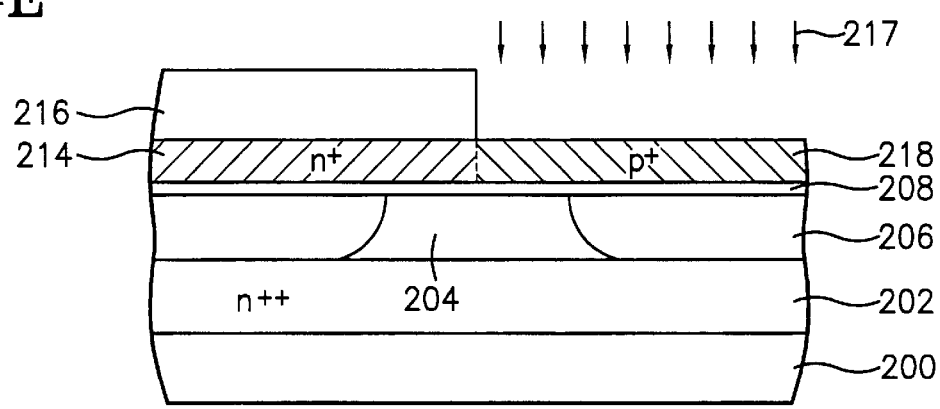
Figure 4F:
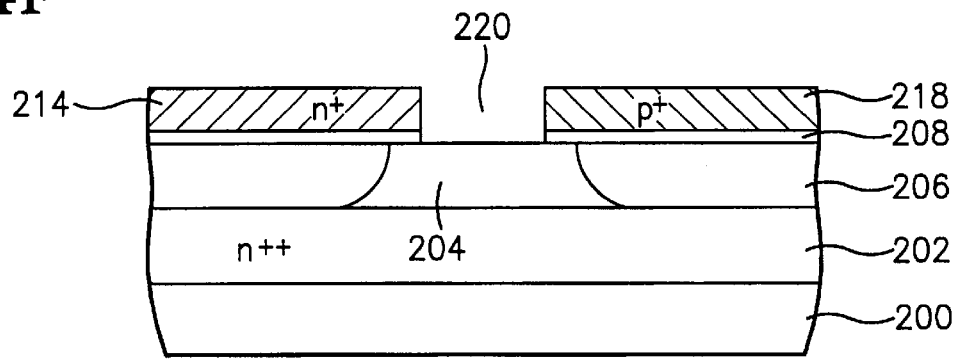

Referring now to FIG. 4C, a first conductive layer 210 is then formed on the first electrically insulating layer 208. This first conductive layer 210 is preferably formed as a polycrystalline silicon layer. This step of forming a first conductive layer 210 may be preceded by the step of depositing an oxide layer (not shown) having a thickness of about 1000 to 2000 Å, on the first electrically insulating layer 208. Referring now to FIG. 4D, an implant mask 212 may then be formed on portion "d" of the first conductive layer 210, to thereby expose portion "c" of the first conductive layer 210. Dopants 213 of first conductivity type (e.g., N-type) are then preferably implanted into a first portion 214 of the first conductive layer 210, to form a highly doped emitter contact of first conductivity type (shown as N+). As described more fully hereinbelow, this first portion 214 comprises an emitter contact of the bipolar junction transistor. Referring now to FIG. 4E, an implant mask 216 is then formed on the first portion 214 of the first conductive layer 210. Dopants 217 of second conductivity type (e.g., P-type) are then preferably implanted into the second portion 218 of the first conductive layer 210, to form a highly doped base contact of second conductivity type (shown as P+) therein. As illustrated best by FIG. 4F, a photolithographically defined etching step is then performed using a mask (not shown) to pattern the first conductive layer 210 and thereby separate the emitter contact 214 from the base contact 218. This patterning step also defines an opening 220 which extends through the first electrically insulating layer 208 and exposes the intrinsic collector region 204. Sidewalls to the emitter contact 214 and base contact 218 are also defined, as illustrated.

Figure 4G:
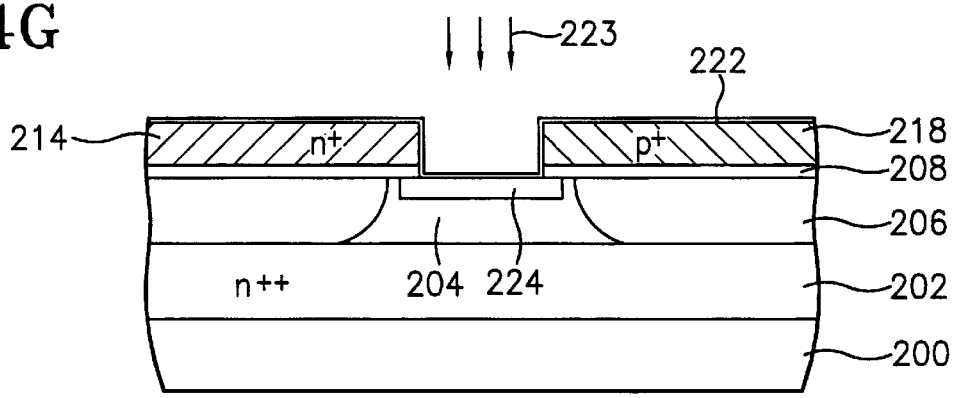

Referring now to FIG. 4G, a sacrifical polycrystalline silicon film 222 having a thickness in a range between about 100 and 500 Å is then formed on the emitter contact 214, base contact 218 and in the opening 220, as illustrated. Dopants 223 of second conductivity type (e.g., P-type) are then selectively implanted through the sacrificial polycrystalline silicon film 222 and the opening 220, to define an intrinsic base region 224 in the intrinsic collector region 204. Here, in contrast to the first embodiment, the edges of the intrinsic base region 224 are spaced apart from the field oxide isolation regions 206. As a result, the intrinsic base region 224 may be scaled to a greater degree and the junction capacitance between the base and collector may be reduced.

Figure 4H:
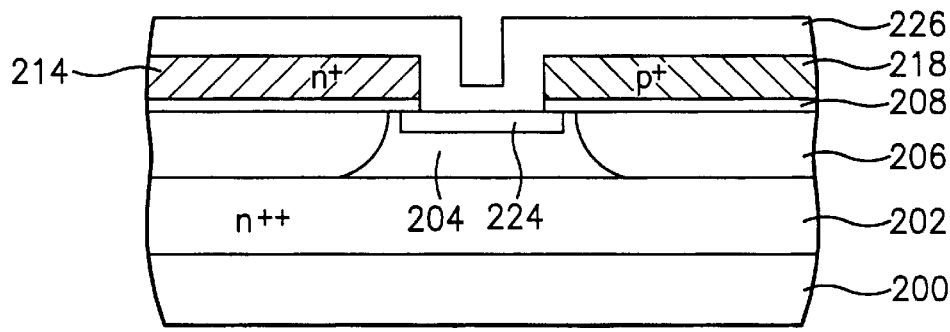
Figure 4I:
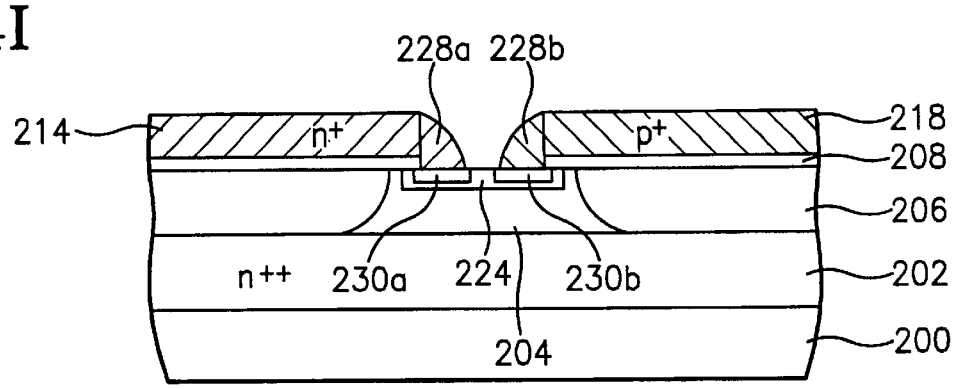

Referring now to FIG. 4H, a second electrically conductive layer 226 of predetermined thickness is then conformally deposited. Here, the second electrically conductive layer 226 may be formed as an undoped polycrystalline silicon layer. The second electrically conductive layer 226 is then patterned to define first and second electrically conductive sidewall spacers 228a and 228b, respectively, as illustrated by FIG. 4I. Here, the electrically conductive sidewall spacers 228a and 228b are formed in a self-aligned manner to the opening 220, by etching the second electrically conductive layer 226 until upper surfaces of the emitter contact 214 and base contact 218 are exposed. Here, the original thickness of the second electrically conductive layer 226 and the duration of the etching step may be carefully controlled to define the widths of the spacers 228a and 228b. A thermal treatment step is also preferably performed to define a self-aligned emitter region 230a and a self-aligned extrinsic base region 230b in the intrinsic base region 224. In particular, a thermal treatment step of sufficient duration is performed to cause diffusion of dopants (e.g., N-type) from the emitter contact 214 to the conductive spacer 228a and into the intrinsic base region 224. This diffusion step defines the emitter region 230a which is self-aligned to the conductive spacer 230a. Similarly, the dopants (e.g., P-type) in the base contact 218 are also diffused through the conductive spacer 228b and into the intrinsic base region 224, to define the extrinsic base region 230b which is self-aligned to the conductive spacer 228b. Here, the extrinsic base region 230b preferably forms a nonrectifying junction (e.g., P+/P) with the intrinsic base region 224.

Figure 4J:
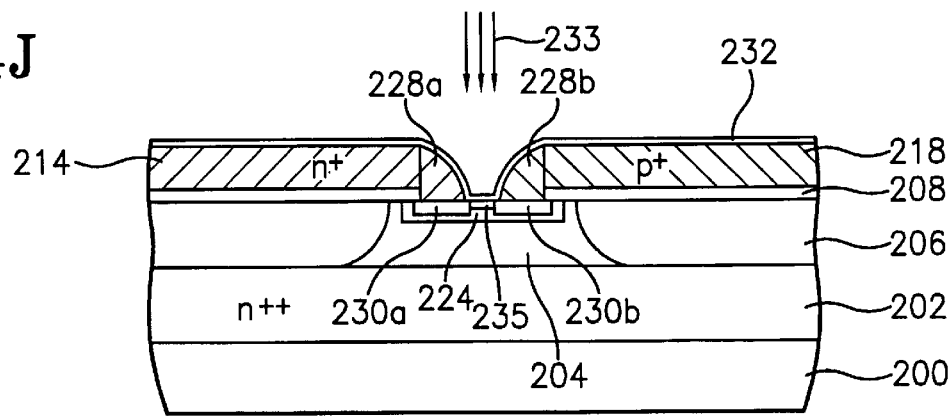

Referring now to FIG. 4J, a thin sacrificial oxide layer 232 is then formed on an upper surface of the emitter contact 214, upper surface of the base contact 218, sidewalls of the conductive spacers 228a and 228b and on an exposed portion of the face of the substrate 200 extending between the adjacent conductive spacers. Dopants 233 of second conductivity type (e.g., P-type) are then selectively implanted through the thin sacrificial oxide layer 232, to define a base link-up region 235 which improves an electrical connection between the intrinsic base region 224 and extrinsic base region 230b. Here, the sacrificial oxide layer 232 is formed to reduce ion implant damage and further anneal and activate the dopants diffused into the emitter and extrinsic base regions 230a and 230b, respectively.

Figure 4K:
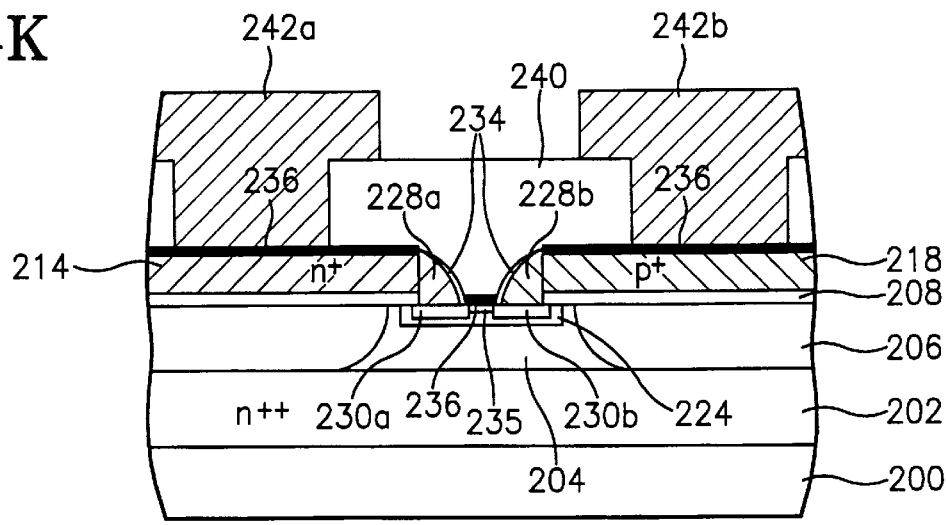

Referring now to FIGS. 3 and 4K, after the thin sacrificial oxide layer 232 is removed, a blanket oxide layer (not shown) having a thickness in a range from between about 1000 and 2000 Å is formed on upper surfaces of the emitter contact 214, base contact 218, conductive sidewall spacers 228a and 228b, and exposed portion of the substrate 200. This blanket oxide layer is then etched to define sidewall insulating spacers 234 on the conductive sidewall spacers 228a and 228b. According to a preferred aspect of the present invention, a layer of metal silicide 236 may be selectively formed as a low resistance contact layer on an upper surface of the emitter contact 214, upper surface of the base contact 236 and on the base link-up region, as illustrated. The layer of metal silicide 236 may be formed by depositing a respective metal and then converting the deposited layer of metal to metal silicide (using silicon provided by the substrate and emitter and base contacts) and then removing portions of the metal on the sidewall insulating spacers 234 which have not been converted to metal silicide. An electrically insulating passivation layer 240 is then formed, as illustrated. Contact windows are then defined in the passivation layer 240, using conventional techniques, to expose the metal silicide layers 236. Conventional metallization techniques can then be used to form emitter and base electrodes 242a and 242b, respectively, to complete the formation of an N-P-N bipolar junction transistor. Similar steps can also be used to form a P-N-P transistor. Accordingly, the methods of the present invention can be used to provided bipolar junction transistors having emitter and base regions with reduced lateral dimensions that are less dependent on photolithographic alignment techniques, and reduced parasitic junction capacitance.

In accordance with a bipolar transistor and a method of fabricating the same as aforementioned, the invention has some advantages in that a) device size may be reduced by scaling down emitter and base regions, and b) the junction capacitance between the base-collector may be also reduced by the scaling down the base region.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a bipolar junction transistor, comprising the steps of:
    forming a semiconductor substrate having an intrinsic collector region therein extending adjacent a face thereof;
    forming a first conductive layer on the semiconductor substrate, opposite the intrinsic collector region;
    implanting dopants of first and second conductivity type into first and second portions of the first conductive layer, respectively;
    patterning the first conductive layer to expose first and second sidewalls on the first and second portions of the first conductive layer, respectively;
    forming a sacrificial polycrystalline silicon layer on the first and second sidewalls;
    implanting dopants of second conductivity type through the sacrificial polycrystalline silicon layer and into the semiconductor substrate to define an intrinsic base region in the intrinsic collector region;
    forming first and second conductive spacers on the first and second sidewalls, respectively; and
    diffusing first conductivity type dopants from the first portion of the first conductive layer to the semiconductor substrate, via the first conductive spacer, to define an emitter region, while simultaneously diffusing second conductivity type dopants from the second portion of the first conductive layer to the semiconductor substrate, via the second conductive spacer, to define an extrinsic base region.

2. The method of claim 1, wherein said step of patterning the first conductive layer comprises patterning the first conductive layer to expose the face of the substrate.

3. The method of claim 2, wherein said step of forming a first conductive layer is preceded by the step of implanting dopants of second conductivity type into the intrinsic collector region, to define an intrinsic base region extending to the face of the semiconductor substrate.

4. The method of claim 1, wherein said step of patterning the first conductive layer comprises patterning the first conductive layer to expose a portion of the face of the semiconductor substrate extending opposite the intrinsic collector region.

5. A method of forming a bipolar junction transistor, comprising the steps of:
    forming a semiconductor substrate having an intrinsic collector region therein extending adjacent a face thereof;
    forming a first conductive layer on the semiconductor substrate, opposite the intrinsic collector region;
    implanting dopants of first and second conductivity type into first and second portions of the first conductive layer, respectively;
    patterning the first conductive layer to expose first and second sidewalls on the first and second portions of the first conductive layer, respectively, and expose a portion of the face of the semiconductor substrate extending opposite the intrinsic collector region;
    forming first and second conductive spacers on the first and second sidewalls, respectively;
    diffusing first conductivity type dopants from the first portion of the first conductive layer to the semiconductor substrate via the first conductive spacer to define an emitter region, while simultaneously diffusing second conductivity type dopants from the second portion of the first conductive layer to the semiconductor substrate via the second conductive spacer to define an extrinsic base region;
    forming a sacrificial oxide layer on the first and second portions of the first conductive layer, first and second conductive spacers and a portion of the face of the semiconductor substrate extending between the first and second conductive spacers and opposite the intrinsic collector region; and
    forming a base link-up region by implanting dopants of second conductivity type through the sacrificial oxide layer and into the portion of the face of the semiconductor substrate extending opposite the intrinsic collector region.

6. The method of claim 5, further comprising the steps of:
    removing the sacrificial oxide layer to expose the first and second portions of the first conductive layer and the first and second conductive spacers;
    forming sidewall insulating spacers on the first and second conductive spacers;
    forming first and second silicide contact layers on the first and second portions of the first conductive layer, respectively; and
    forming emitter and base electrodes on the first and second silicide contact layers, respectively.

7. The method of claim 4, wherein said step of patterning the first conductive layer comprises patterning the first conductive layer to expose a portion of the face of the semiconductor substrate extending opposite the intrinsic collector region; and wherein said diffusing step is followed by the steps of forming a sacrificial oxide layer on the first and second portions of the first conductive layer, first and second conductive spacers and a portion of the face of the semiconductor substrate extending between the first and second conductive spacers and opposite the intrinsic collector region.

8. The method of claim 7, further comprising the step of forming a base link-up region by implanting dopants of second conductivity type through the sacrificial oxide layer and into the portion of the face of the semiconductor substrate extending opposite the intrinsic collector region.

9. The method of claim 8, further comprising the steps of:
    removing the sacrificial oxide layer to expose the first and second portions of the first conductive layer and the first and second conductive spacers;
    forming sidewall insulating spacers on the first and second conductive spacers;
    forming first and second silicide contact layers on the first and second portions of the first conductive layer, respectively; and forming emitter and base electrodes on the first and second silicide contact layers, respectively.

10. The method of claim 9, wherein said step of forming sidewall insulating spacers comprises the steps of:

depositing an oxide layer having a thickness in a range between about 1000 and 2000 Å, on the first and second portions of the first conductive layer and the first and second conductive spacers; and then etching the deposited oxide layer to expose the first and second portions of the first conductive layer.

11. The method of claim 1, wherein the first conductive layer comprises a first polycrystalline silicon layer and wherein said step of forming first and second conductive spacers comprises the steps of conformally depositing a second polycrystalline silicon layer on upper surfaces of the first and second portions of the first conductive layer and on the first and second sidewalls and then etching the second polycrystalline silicon layer to expose the upper surfaces of the first and second portions of the first conductive layer.

* * * * *